(12) United States Patent
Geomini

(10) Patent No.: US 7,018,482 B1
(45) Date of Patent: Mar. 28, 2006

(54) METHOD OF MANUFACTURING ELECTRONIC DEVICES, AND APPARATUS FOR CARRYING OUT SUCH A METHOD

(75) Inventor: Marcellinus J. H. J. Geomini, Crolles (FR)

(73) Assignee: Koninklijke Philips Electronics N.V., Eindhoven (NL)

( * ) Notice: Subject to any disclaimer, the term of this patent is extended or adjusted under 35 U.S.C. 154(b) by 260 days.

(21) Appl. No.: 09/595,310

(22) Filed: Jun. 16, 2000

(30) Foreign Application Priority Data

Jun. 17, 1999 (EP) .............................. 99201954

(51) Int. Cl.
*B08B 7/04* (2006.01)

(52) U.S. Cl. .................. 134/18; 205/205; 205/210; 205/219; 436/55; 436/149; 436/150; 422/82.01; 422/82.02; 434/2; 434/3; 434/25.1; 434/25.4; 434/25.5; 434/32; 434/41; 434/42; 434/902

(58) Field of Classification Search ............. 205/205, 205/210, 219; 436/55, 149, 150; 422/82.01, 422/82.02; 134/18, 2, 3, 25.1, 25.4, 25.5, 134/32, 41, 42, 902
See application file for complete search history.

(56) References Cited

U.S. PATENT DOCUMENTS

| | | | | |
|---|---|---|---|---|
| 2,979,843 | A | * | 4/1961 | Triman .............................. 41/9 |
| 4,996,160 | A | * | 2/1991 | Hausman Hazlitt et al. .... 436/2 |
| 5,439,569 | A | | 8/1995 | Carpio ........................ 204/153 |
| 5,779,927 | A | | 7/1998 | Lo ............................... 216/84 |
| 5,788,801 | A | | 8/1998 | Barbee et al. .............. 156/345 |
| 6,261,845 | B1 | * | 7/2001 | Verhaverbeke et al. ....... 436/55 |

FOREIGN PATENT DOCUMENTS

| | | | |
|---|---|---|---|
| JP | 60114579 | | 6/1985 |
| JP | 03-283488 | * | 12/1991 |
| JP | 06-061218 | * | 3/1994 |
| JP | 09129588 | | 5/1997 |
| JP | 10326769 | | 12/1998 |
| WO | WO00/79583 | * | 12/2000 |

OTHER PUBLICATIONS

"In–Situ Chemical Concentration Control for Wafer Wet Cleaning", by Ismail Kashkoush, et al, Mat. Res. Soc. Symp. Proc. vol. 477, 1997.

* cited by examiner

*Primary Examiner*—Sharidan Carrillo
(74) *Attorney, Agent, or Firm*—Aaron Waxler (57) ABSTRACT

A method of manufacturing electronic devices, in particular, but not exclusively, semiconductor devices, and apparatus for carrying out such a method, in which method wafers 1, which are provided at a surface 2 with a material 3 to be removed, are subjected, while being divided into successive batches, to a wet treatment in a bath 4 containing a solution 5 of an active component in a solvent. The successive batches of wafers 1 are immersed in the solution 5 at first time intervals during the wet treatment of the successive batches, which first time intervals each consist of a processing period during which the material 3 is removed from the surface 2 of the wafers 1, thereby forming ionic components, and a waiting period following the removal of the wafers 1 from the bath 4 at the end of the processing period. During the wet treatment of the successive batches the conductivity of the solution 5 is monitored, which monitored conductivity is brought to approximately a desired conductivity at second time intervals during the wet treatment of the successive batches by adding the active component or the solvent, or both, to the solution 5 inside the bath 4. In order to improve the process stability of the wet treatment of the successive batches of wafers 1 in the solution 5 of the active component in the solvent and to lengthen the lifetime of the bath 4 containing the solution 5, the desired conductivity is changed at third time intervals during the wet treatment of the successive batches with a value, which value is determined at each one of the third time intervals on the basis of the amount of the material removed during the latest completed one of the third time intervals.

6 Claims, 5 Drawing Sheets

METHOD OF MANUFACTURING ELECTRONIC DEVICES, AND APPARATUS FOR CARRYING OUT SUCH A METHOD

BACKGROUND OF THE INVENTION

The invention relates to a method of manufacturing electronic devices, in particular, but not exclusively, semiconductor devices, in which method wafers, which are provided at a surface with a material to be removed, are subjected, while being divided into successive batches, to a wet treatment in a bath containing a solution of an active component in a solvent, during which wet treatment the successive batches of wafers are immersed in the solution at first time intervals, which first time intervals each consist of a processing period during which the material is removed from the surface of the wafers, thereby forming ionic components, and a waiting period following the removal of the wafers from the bath at the end of the processing period, during which wet treatment of the successive batches the conductivity of the solution is monitored, which monitored conductivity is brought to approximately a desired conductivity at second time intervals during the wet treatment of the successive batches by adding at least one of the active component and the solvent to the solution inside the bath.

An important wet treatment in IC manufacturing technology involves wet etching of silicon oxide, which is frequently carried out in a bath containing a hydrofluoric acid solution ($HF/H_2O$). Besides etching of silicon oxide, hydrofluoric acid solutions may also be used for etching of, for example, silicon nitride and silicon oxynitride. Other important wet treatments make use of, for example, the widely known RCA solutions, i.e. the ammonia hydrogen peroxide solution ($NH_4OH/H_2O_2/H_2O$), which is effectively used for particle removal with (re-)growth of clean chemical oxide on silicon surfaces and is known as standard clean 1 (SC1), and the hydrochloric acid hydrogen peroxide solution ($HCl/H_2O_2/H_2O$), which is effectively used for metal removal and is known as standard clean 2 (SC2).

Consumption of components of the solution as a result of the removal of material from the surface of the wafers, evaporation of volatile components from the solution, and drag-out of components from the solution as a result of the removal of wafers from the bath are important factors influencing the chemical composition of the solution in the course of time. As the rate of etching or removal depends inter alia on the chemical composition of the solution, it is important to monitor and control the chemical composition of the solution, so as to achieve a better process control. An important category of techniques applied for monitoring and controlling the chemical composition of solutions are based on measurement of the solution conductivity in the course of time.

A method of the kind mentioned in the opening paragraph is known from an article entitled "In-situ chemical concentration control for wafer wet cleaning", written by Ismail Kashkoush et al. and published in Mat. Res. Soc. Symp. Proc., Vol. 477 (1997), pp. 311–316. In this method, the monitored conductivity of a hydrofluoric acid solution ($HF/H_2O$) is brought to approximately the desired conductivity at the second time intervals by adding hydrofluoric acid and/or deionized water. The monitored conductivity of an ammonia hydrogen peroxide solution ($NH_4OH/H_2O_2/H_2O$) is brought to approximately the desired conductivity at the second time intervals by adding ammonia and/or deionized water, whereas hydrogen chloride and/or deionized water are added in the case of a hydrochloric acid hydrogen peroxide solution ($HCl/H_2O_2/H_2O$). As the fluctuations in the concentration of hydrogen peroxide in both RCA solutions, and the effect of hydrogen peroxide on the conductivity of these solutions are minimal, hydrogen peroxide is added independently according to defined time intervals.

It has been experimentally observed that, although the conductivity of the solution inside the bath is accurately controlled by bringing the monitored conductivity to approximately the desired conductivity at the second time intervals, a decrease in removal or etch rate of the material takes place from batch to batch during the wet treatment of the successive batches of wafers. In this way, a deterioration of the process stability of the wet treatment of the successive batches takes place, and the lifetime of the bath containing the solution is shortened.

SUMMARY OF THE INVENTION

It is an object of the invention to provide a method of the kind mentioned in the opening paragraph, which method improves the process stability of the wet treatment of successive batches of wafers in a bath containing a solution of an active component in a solvent and lengthens the lifetime of the bath containing the solution.

According to the invention, this object is achieved in that at third time intervals during the wet treatment of the successive batches, the desired conductivity is changed with a value, which value is determined at each one of the third time intervals on the basis of the amount of the material removed during the latest, completed one of the third time intervals.

The invention is based inter alia on the insight that the ionic components, which are formed as a result of the removal of the material from the surface of the wafers, contribute to the monitored conductivity. In the prior art method, the monitored conductivity is brought to approximately the desired conductivity at the second time intervals by adding at least one of the active component and the solvent to the solution in the bath, without compensating for the contribution of the above-mentioned additionally formed ionic components to the monitored conductivity. As a result, the concentration of the active component in the solution and, hence, the rate of removal of the material decreases during the wet treatment of the successive batches of wafers. This can be counteracted by changing the desired conductivity at third time intervals during the wet treatment of the successive batches with a value, which value compensates for the contribution of the additionally formed ionic components to the monitored conductivity. By using the measure in accordance with the invention, this value is determined at each one of the third time intervals on the basis of the amount of the material removed during the latest, completed time interval. In this way, the process stability of the wet treatment is improved, and the lifetime of the bath is lengthened.

For reasons of adequacy, the value with which the desired conductivity is changed at the third time intervals is advantageously determined on the basis of the amount of material removed during the latest, completed one of the third time intervals by dividing said amount by a reference amount of the material removed during processing of a reference batch of wafers, and multiplying said amount by a corresponding reference change in conductivity monitored during processing of the reference batch of wafers.

At the second time intervals the monitored conductivity is brought to approximately the desired conductivity by adding at least one of the active component and the solvent to the solution in the bath. As already mentioned before, no compensation is carried through for the contribution of the ionic components to the monitored conductivity, which ionic components are formed as a result of the removal of the material from the surface of the wafers. As a result, unnecessary amounts of either the active component or the solvent are added to the solution at the second time intervals. Whether the active component or the solvent is added in too large amounts depends on the conductive contribution of the formed components relative to the conductive contribution of the active component. At the third time intervals the above-mentioned unnecessary amounts of either the active component or the solvent again have to be counterbalanced by the addition of amounts of the solvent or the active component, respectively. Hence, a needless waste of chemicals takes place. In order to avoid this, it is advantageous to bring the monitored conductivity to approximately the desired conductivity only during the waiting period of each one of the first time intervals.

Moreover, the above measure also counteracts the occurrence of spatial non-uniformities in the chemical composition of the solution in the bath during processing of each one of the successive batches, which spatial non-uniformities may form as a result of locally admitting at least one of the active component and the solvent into the solution. For the same reason, the desired conductivity is also advantageously changed only during the waiting period of each one of the first time intervals.

As the effect of neglecting the contribution of additionally formed ionic components to the monitored conductivity of the solution is more pronounced for dilute solutions, the method in accordance with the invention is more effective if the solution of the active component in the solvent is applied as a dilute solution. Moreover, in view of the continued miniaturization of semiconductor devices, dilute solutions are becoming increasingly important in IC manufacturing technology.

Further advantageous embodiments of the method in accordance with the invention are described in other dependent claims.

The invention further relates to an apparatus for carrying out the method mentioned in the opening paragraph, the apparatus comprising a bath containing the solution and accommodating the wafers, means for monitoring the conductivity of the solution, and controlling means for bringing the monitored conductivity to approximately the desired conductivity at the second time intervals.

Such an apparatus is known from an article entitled "In-situ chemical concentration control for wafer wet cleaning", written by Ismail Kashkoush et al. and published in Mat. Res. Soc. Symp. Proc., Vol. 477 (1997), pp. 311–316.

In order to improve the process stability of the wet treatment of the successive batches of wafers in a solution of an active component in a solvent, and to increase the lifetime of the bath containing this solution, the apparatus in accordance with the invention is characterized in that it comprises computing means capable of determining at each one of the third time intervals the value with which the desired conductivity is changed, which value is based on the amount of the material removed during the latest, completed one of the third time intervals.

The amount of the material removed during the latest, completed one of the third time intervals is dependent on the number of wafers processed during the latest completed one of the third time intervals, the surface area of each one of these wafers, the percentage of the surface area of each one of these wafers that is covered by the material, the thickness over which the material is removed during the latest, completed one of the third time intervals, and the density of the material. It is evident to a person skilled in the art that these parameters will often assume other values while changing over from one third time interval to another. In order to achieve at a larger flexibility as regards the determination of the value with which the desired conductivity is to be changed at the third time intervals, the computing means advantageously comprise program means, which use number of wafers, surface area of each one of the wafers, percentage of the surface area of each one of the wafers that is covered by the material, removed thickness of the material, and density of the material, as parameters, which parameters are related to the latest, completed one of the third time intervals.

In order to further automate the determination of the value with which the desired conductivity is to be changed at the third time intervals, the computing means may also advantageously comprise storage means for storing a reference amount of the material removed during processing of a reference batch of wafers and a corresponding reference change in conductivity monitored during processing of the reference batch of wafers. Instead of storing the reference amount of the material removed, parameters needed to determine this amount may be stored by the storing means, that is to say reference number of wafers, reference surface area of each one of the wafers, reference percentage of the surface area of each one of the wafers that is covered by the material, reference change in thickness of the material, and reference density of the material.

BRIEF DESCRIPTION OF THE DRAWING

These and other aspects of the invention will be apparent from and elucidated with reference to the embodiments described hereinafter. In the drawings.

DESCRIPTION OF THE PREFERRED EMBODIMENT

Figure 1:
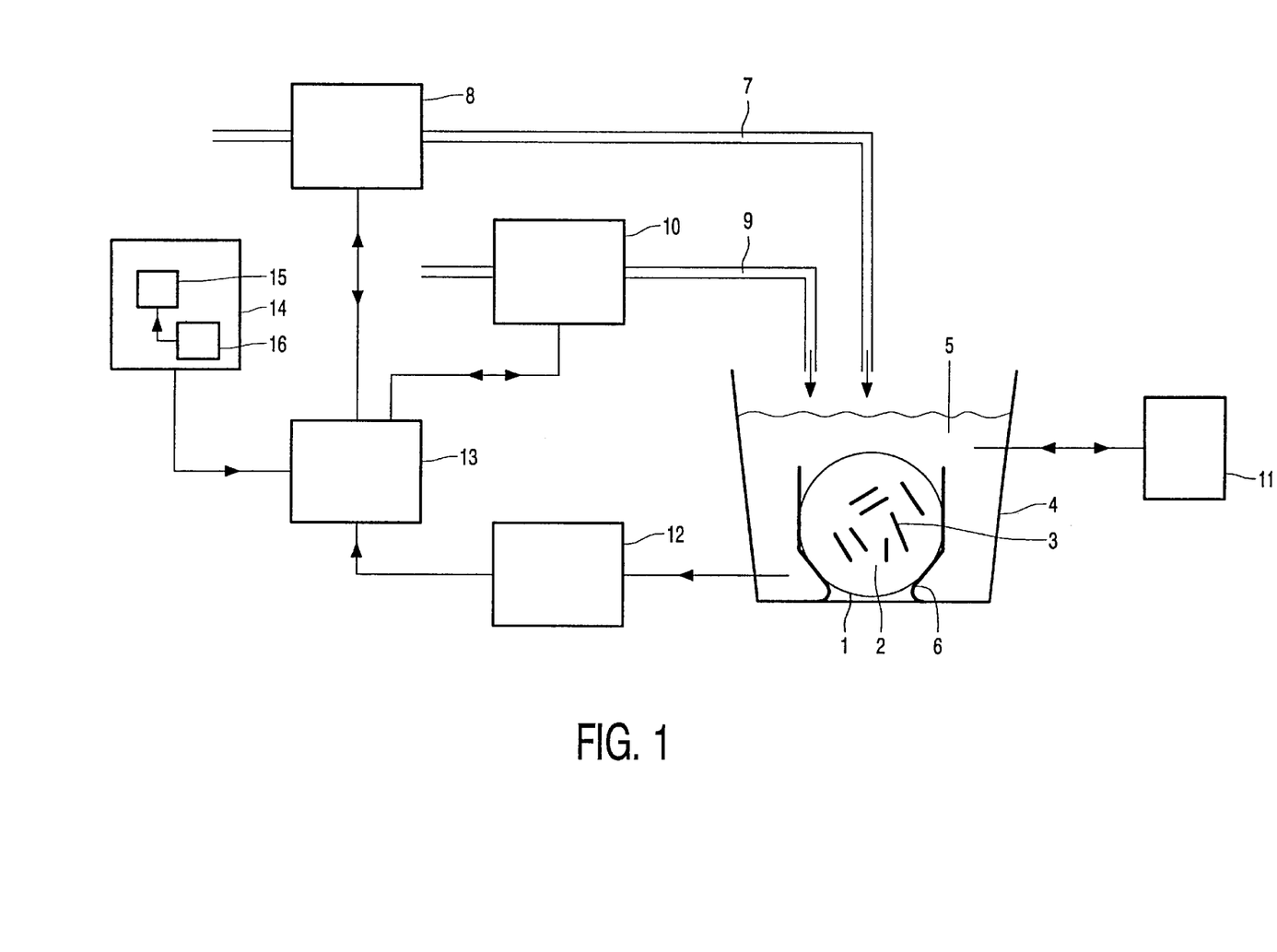
FIG. 1 shows in a diagrammatic view the apparatus in accordance with the invention.

FIG. 1 shows an apparatus for carrying out a method for wet treating successive batches of wafers 1 (only one wafer shown), which wafers 1 are provided at a surface 2 with a material 3 to be removed, the apparatus comprising a bath 4 containing a solution 5 of an active component in a solvent, in which solution 5 the successive batches of wafers 1 are immersed at first time intervals $\tau_1$. The wafers 1 of each one of the successive batches may be loaded on a wafer cassette or boat 6. The active component can be admitted into the bath 4 from a container (not shown) placed upstream from supply line 7, which supply line 7 includes a control flow valve 8 for controlling the amount of active component admitted into the bath 4. The solvent can be admitted into the bath 4 from a container (not shown) placed upstream from supply line 9, which supply line 9 includes a control flow valve 10 for controlling the amount of solvent admitted into the bath 4. A heater 11 may be present in a recirculation loop (not shown) of the bath 4 for heating the solution 5 to a desired temperature. Means 12 for monitoring the conductivity of the solution 5 are present, which means 12 comprise, for example, an electrodeless "flow-through" conductivity sensor positioned in the above-mentioned recirculation loop. Such a sensor monitors the conductivity of the solution 5 by inducing an alternating current in a closed loop of the solution 5 and measuring the magnitude of the current, the current being proportional to the conductivity of the solution 5. The conductivity monitored using the above-mentioned electrodeless sensor has units µS(iemens)/cm, the addition per cm being inherent in the way of monitoring the conductivity. The monitored conductivity $C_M$, or a signal, for example a magnified current, proportional to it, is passed on to controlling means 13. The controlling means 13 compare the monitored conductivity $C_M$ with a desired conductivity $C_D$, that is to say a target conductivity, and carry through a corrective action in order to bring the monitored conductivity $C_M$ to approximately the desired conductivity $C_D$ at second time intervals T2 during the wet treatment of the successive batches of wafers 1. In the corrective action at least one of the active component and the solvent are added to the solution 5 in the bath 4. Specifically, when a drop in the monitored conductivity $C_M$ of a solution 5 of hydrofluoric acid (HF) in water is detected, a signal is sent by the controlling means 13 to the control flow valve 8 in order to add hydrofluoric acid to the solution 5 in the bath 4. Alternatively, when a rise in the monitored conductivity $C_M$ of the same solution 5 is detected, a signal is sent by the controlling means 13 to the control valve 10 in order to add deionized water to the solution 5 in the bath 4. It is possible, however, that hydrofluoric acid is excessively added in the first situation, thereby raising the monitored conductivity $C_M$ to well above the desired conductivity $C_D$. In that case, deionized water is immediately added to compensate for the excessively added hydrofluoric acid and to lower the monitored conductivity $C_M$ again to approximately the desired conductivity $C_D$. Similarly, if deionized water is excessively added in the second situation, thereby lowering the monitored conductivity $C_M$ to well below the desired conductivity $C_D$, hydrofluoric acid is immediately added to compensate for the excessively added deionized water and to raise the monitored conductivity $C_M$ again to approximately the desired conductivity $C_D$.

The apparatus further comprises computing means 14 capable of determining at each one of the third time intervals $\tau_3$ a value $\Delta C_D$ with which the desired conductivity $C_D$ is changed, which value $\Delta C_D$ is based on the amount $\Delta G$ of the material 3 removed during the latest, completed one of the third time intervals $\tau_3$. The value $\Delta C_D$, or a signal, for example a magnified current, being proportional to it, is passed on to the controlling means 13 at the third time intervals $\tau_3$, and the desired conductivity $C_D$ is changed accordingly. For the purpose of determining the value $\Delta C_D$ with which the desired conductivity $C_D$ is changed at the third time intervals $\tau_3$, the computing means 14 advantageously comprise program means 15 using number of the wafers 1 (N), surface area of each one of the wafers 1 (A), percentage of the surface area of each one of the wafers 1 that is covered by the material 3 (x), removed thickness of the material 3 ($\Delta$d), and density of the material 3 ($\rho$), as parameters, which parameters are related to the latest, completed one of the third time intervals $\tau_3$. The computing means may also advantageously comprise storage means 16 for storing a reference amount $\Delta G_{ref}$ of the material 3 removed during processing of a reference batch of wafers and a corresponding reference change $\Delta C_{ref}$ in conductivity monitored during processing of the reference batch of wafers. Instead of storing the reference amount $\Delta G_{ref}$ of the material 3 removed, parameters used to determine this amount may be stored. These parameters are the reference number of wafers ($N_{ref}$), reference surface area of each one of the wafers ($A_{ref}$), reference percentage of the surface area of each one of the wafers covered by the material 3 ($x_{ref}$), reference change in thickness of the material 3 ($\Delta d_{ref}$), and reference density of the material 3 ($\rho_{ref}$).

An important wet treatment in IC manufacturing technology involves wet etching of thin silicon oxide layers, that is to say silicon oxide layers having a thickness of several nanometers up to several tens of nanometers, which is frequently carried out in dilute solutions of hydrofluoric acid (HF) in water having a weight percentage HF in the range from about 0.1 to 5.0. Weight percentage will hereinafter be used in abbreviated form as wt. %.

FIGS. 2 to 7 show in diagrammatic cross-sectional views successive stages in the Shallow Trench Isolation (STI) process, which is used in deep-submicron CMOS technology for electrically insulating semiconductor devices from one another by means of thick field insulating regions. In the example below, the semiconductor devices are conventional field-effect transistors. It will be evident to those skilled in the art that the semiconductor devices may also be provided as, for example, memory devices, thin film transistors, active arrays for driving liquid crystal displays (LCD's), or as CMOS or BICMOS integrated circuits known per se.

Figure 2:
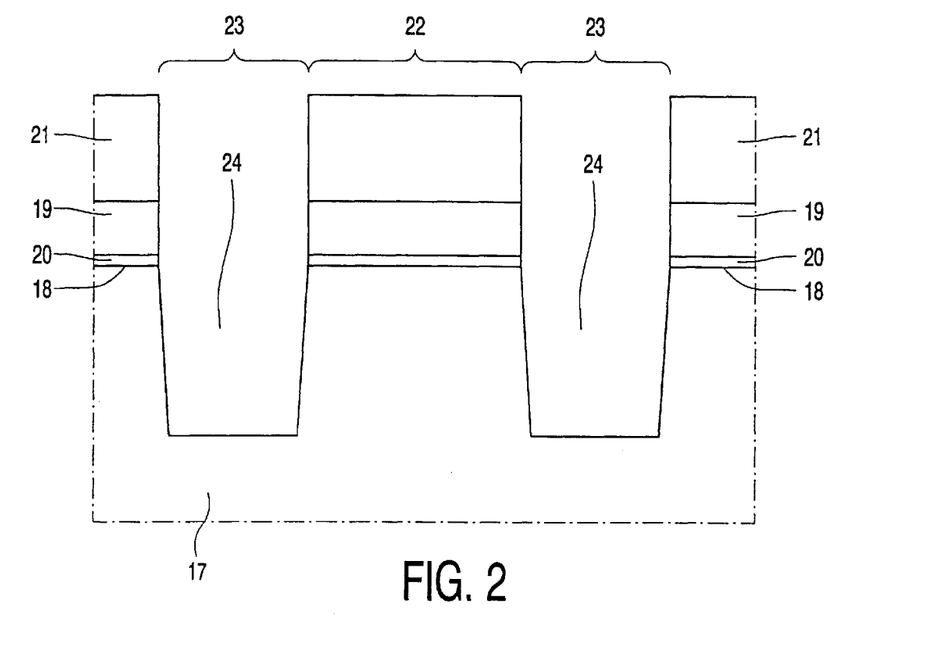
FIGS. 2 to 7 show in diagrammatic cross-sectional views successive stages in the manufacture of semiconductor devices, using the method in accordance with the invention and the apparatus shown in FIG. 1.

With reference to FIG. 1, a semiconductor body 17, in the present example a silicon body of p-type conductivity, is provided at a surface 18 with a silicon nitride layer 19, having a thickness of, for example, about 150 nm, on top of a thermally grown silicon oxide layer 20 having a thickness of, for example, about 10 nm. The thermal silicon oxide layer 20 is often referred to as pad oxide layer. Subsequently, a mask 21 of a resist is applied which covers active areas 22 for the future field-effect transistors and exposes areas 23 of the future field insulating regions. The silicon nitride layer 19 and the thermal silicon oxide layer 20 are etched, thereby exposing the surface 18 of the silicon body 17 at the areas 23 of the future field insulating regions. At these areas 23, trenches 24 are etched into the silicon of the body 17 to a depth of, for example, 0.3 µm by means of anisotropic etching.

Figure 3:
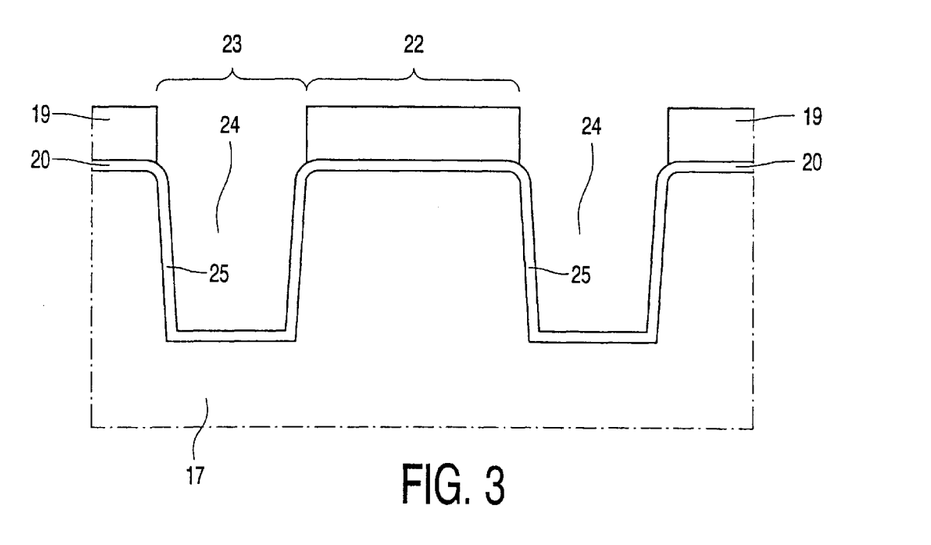
Figure 4:
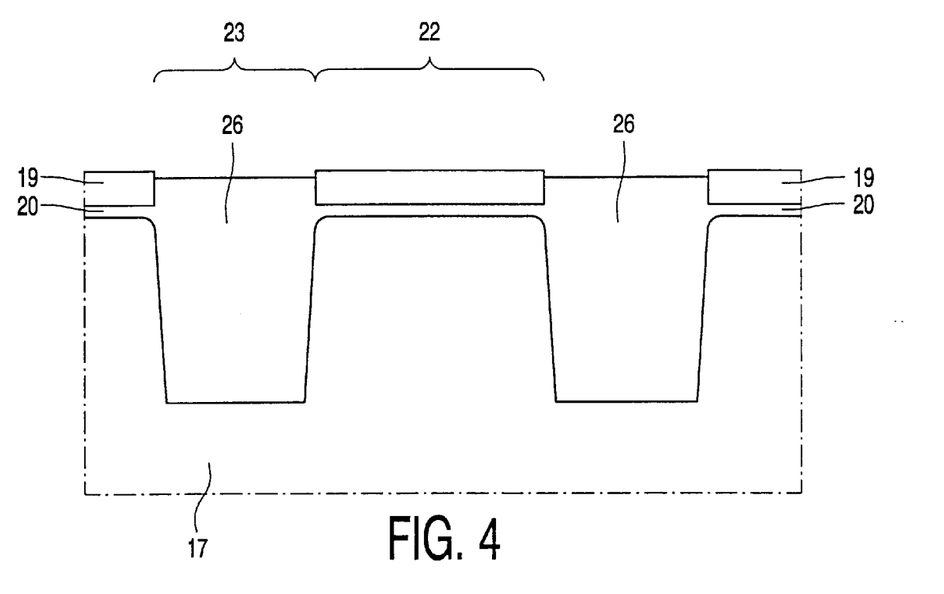
Figure 5:
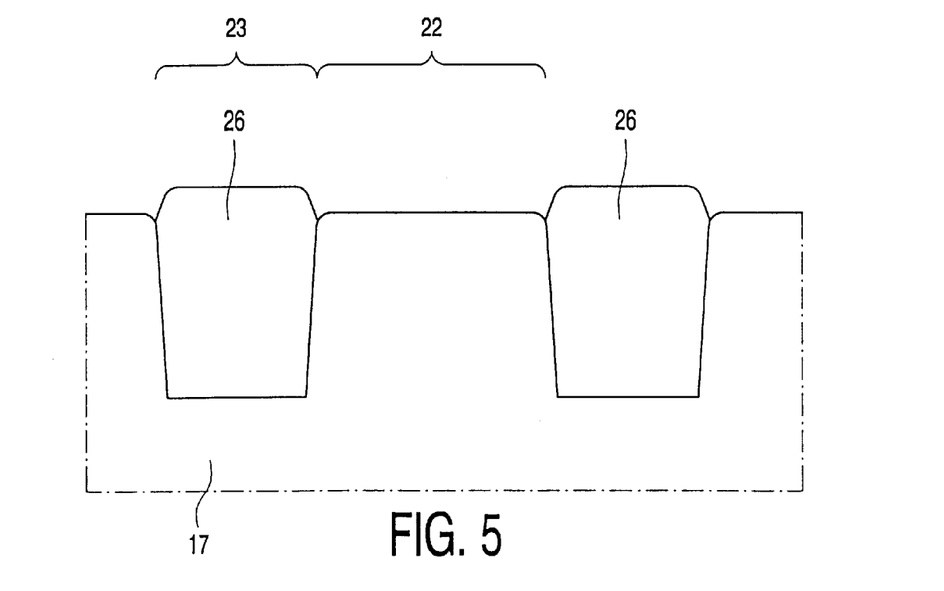
Figure 6:
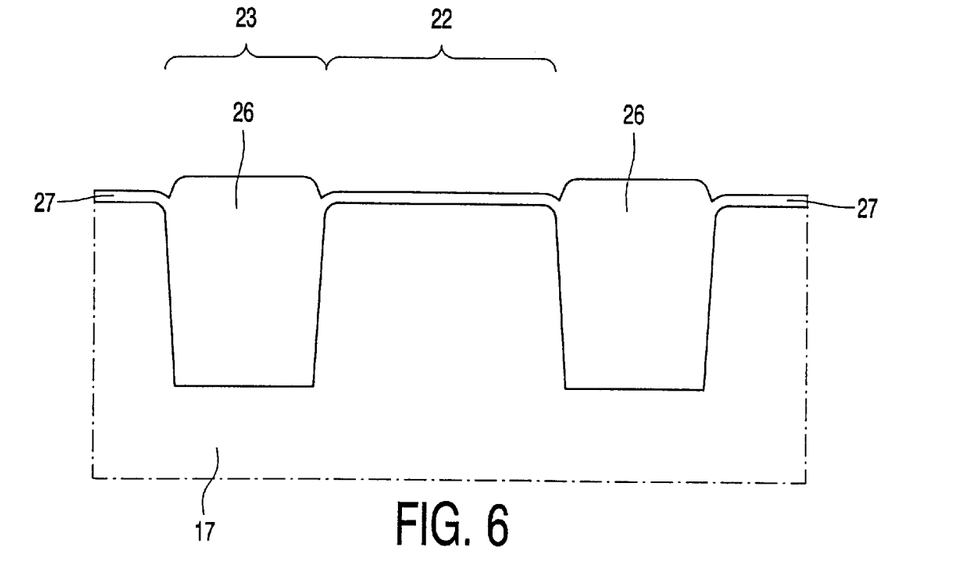

After removal of the mask 21 of resist, a thermally grown silicon oxide layer 25 is provided on the walls of the trenches 24 (FIG. 3). In order to eliminate damage to the silicon as a result of the anisotropic etching, and to provide the trenches 24 with a moderate corner radius, the thermal silicon oxide layer 25 may be removed by wet etching using a solution of, for example, 0.5 wt. % hydrofluoric acid (HF) in water and be regrown by thermal oxidation.

Subsequently (FIG. 4), the trenches 24 are filled with silicon oxide. This may be carried out in two steps by depositing a high-density silicon oxide layer in a thickness of, for example, about 400 nm and a TEOS silicon oxide layer in a thickness of, for example, about 500 nm. In the present example, however, the trenches 24 are filled in one step by depositing a TEOS silicon oxide layer 26 of, for example, about 750 nm and annealing it at a relatively high temperature in order to reach densification. The TEOS silicon oxide layer 26 is etched back by means of, for example, chemical mechanical polishing (CMP) until the silicon nitride layer 19 is reached, which silicon nitride layer 19 acts as a stop layer. During the above CMP treatment the silicon nitride layer 19 is also removed over a part of its thickness, for example over about 50 nm.

In a next step (FIG. 5), the silicon nitride layer 19 is selectively removed over its remaining thickness, in the present example over about 100 nm, by means of wet etching using boiling $H_3PO_4$ solution. The thermal silicon oxide or pad oxide layer 20 is removed by wet etching using a solution of, for example, about 0.5 wt. % hydrofluoric acid (HF) in water.

Then (FIG. 6), a further, thermally grown silicon oxide layer 27 is provided in a thickness of, for example, about 10 nm, which further thermal silicon oxide layer 27 is often referred to as sacrificial oxide layer. At this stage of the process, several implants (not shown) such as, for example n-well implants, threshold voltage adjust implants and anti-punchthrough implants, may be carried out.

Figure 7:
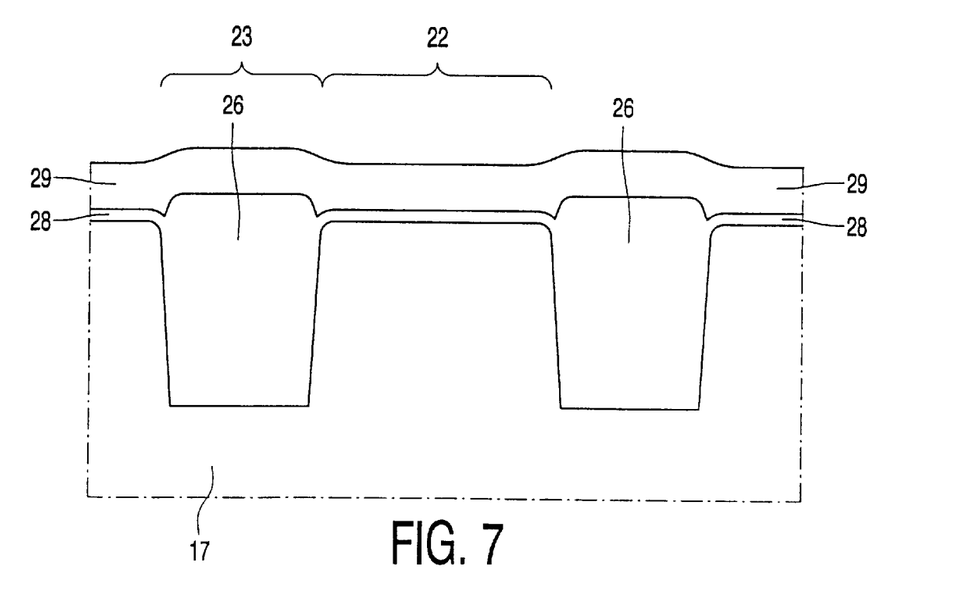

With reference to FIG. 7, the further thermal silicon oxide or sacrificial oxide layer 27 is removed by wet etching using a solution of, for example, about 0.5 wt. % hydrofluoric acid (HF) in water. A gate oxide layer 28 is applied in a thickness of, for example, about 5 nm, and a polycrystalline silicon layer 29 is deposited in a thickness of, for example, about 200 nm and subsequently patterned.

The field-effect transistors are further completed by conventional CMOS process flow steps (not shown) for, for example, source/drain implantation, oxide deposition, contact definition and metallization with one or more metal layers.

Figure 8:
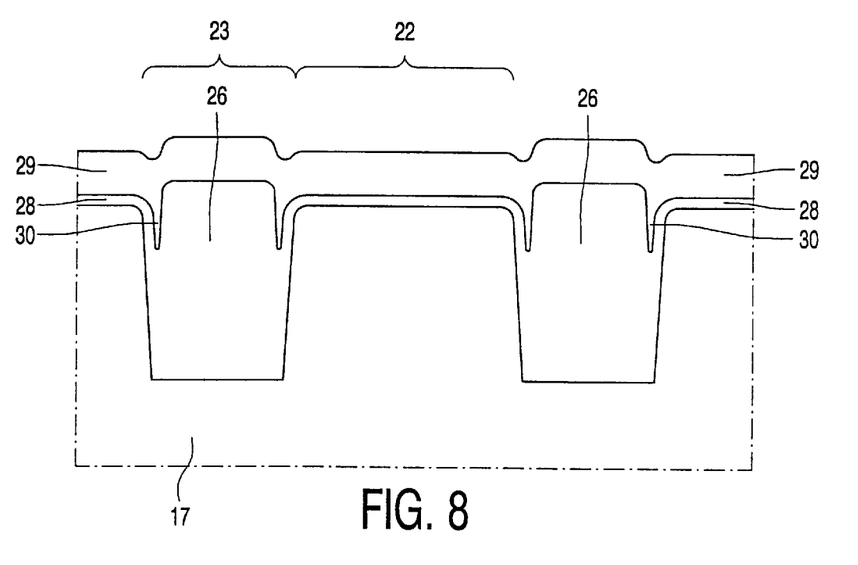
FIG. 8 shows in a diagrammatic cross-sectional view the situation of FIG. 7 after intentionally overetching of the pad oxide layer and sacrificial oxide layer.

The wet etching steps for removal of the pad oxide layer 20 and the sacrificial oxide layer 27 are critical. As these steps are carried out isotropically, overetching, that is to say excessive etching, may lead to kinks 30 (see FIG. 8) at the corners of the active areas 22, which are filled up by the deposition of the polycrystalline silicon layer 29. The kinks 30 filled up with polycrystalline silicon give rise to parasitic transistors having a threshold voltage below that measured for the field-effect transistors at the center of the active areas 22, thereby also giving rise to disadvantageous leakage currents. It is therefore important to minimize overetching.

The method in accordance with the invention will now be illustrated for the wet etching of the sacrificial oxide layer 27 using the solution of 0.5 wt. % hydrofluoric acid (HF) in water and the apparatus shown in FIG. 1. The aforementioned material 3 to be removed thus comprises thermal silicon oxide in the present example. It will be evident that the thermal silicon oxide layer 25 and particularly the pad oxide layer 20 can be wet etched in the same way.

First, a reference batch of wafers is etched. The reference batch contains, for example, 50 wafers ($N_{ref}$), each one of them having a surface area of, for example, 324 cm² ($A_{ref}$), which surface area corresponds to a diameter of 8 inches. The percentage of the surface area of each one of the wafers that is covered by thermal silicon oxide is, for example, 200 ($x_{ref}$), meaning that both main surfaces of each one of the wafers are completely covered. This can be accomplished by subjecting the wafers to maskless thermal oxidation, in which a layer of silicon oxide of a thickness of, for example, 750 nm is grown on both main surfaces of each one of the wafers. The density of the thermal silicon oxide is, for example, 2.27 g/cm³ ($\rho_{ref}$).

A solution of 0.5 wt. % hydrofluoric acid (HF) in water is prepared by mixing the desired ratio of, for example, about 49 wt. % HF with deionized water. The desired etch temperature is, for example, about 21° C. It should be noted, that, although the successive batches of wafers will be processed in a solution of 0.5 wt. % HF in water, a solution of another weight percentage HF in water may be used for processing the reference batch of wafers. However, the etch temperature applied during processing the reference batch of wafers and the etch temperature to be used during processing the successive batches of wafers has to be the same.

After the solution has been sufficiently mixed and has reached the desired etch temperature of 21° C., the reference batch of wafers is immersed in the solution for a certain time period. During this time period thermal silicon oxide is removed from the main surfaces of the wafers according to the reaction $$SiO_2 + 6HF \rightarrow H_2SiF_6 + 2H_2O$$

in which fluosilicic acid ($H_2SiF_6$) and water are formed, while the conductivity of the solution is monitored using the means 12, in the present example the electrodeless "flow-through" conductivity sensor. The monitored conductivity $C_M$ is determined mainly by the concentrations of the ionic components $H^+$, $F^-$, , and $SiF_6^{2-}$, which originate from the hydrofluoric acid used as the active component and from the fluosilicic acid ($H_2SiF_6$) formed according to the above reaction. At the end of the time period the wafers are removed from the bath 4, and a reference change $\Delta C_{ref}$, in the present example a reference increase of, for example 50000 μS(iemens)/cm, is detected in the monitored conductivity $C_M$ compared to the situation before immersion of the wafers in the solution. This reference increase is the overall effect of several events occurring during the above time period, such as consumption of hydrofluoric acid according to the above reaction, evaporation of hydrofluoric acid and, in particular, water from the solution, and formation of fluosilicic acid ($H_2SiF_6$) according to the above reaction. The above time period has been chosen such that the layer of thermal silicon oxide provided on both main sides of the wafers is removed over a part, for example about 500 nm, of its thickness, which value corresponds to the aforementioned reference change $\Delta d_{ref}$ in thickness. The reference amount $\Delta G_{ref}$ of thermal silicon oxide removed during processing of the reference batch of wafers can be obtained from:

$$\Delta G_{ref} = N_{ref} A_{ref} x_{ref} \Delta d_{ref} \rho_{ref}$$

and amounts to about 3.7 grams in the present example. The value of $x_{ref}$, which is 200% in the present example, has been entered in the above equation after dividing by 100.

It should be realized that the electrodeless "flow-through" conductivity sensor is used in non-calibrated form in the present example. Hence, relative changes instead of absolute changes in the conductivity are monitored. Values ascribed to the monitored conductivity $C_M$ and the desired conductivity $C_D$ should therefore be considered with care.

While being divided into successive batches, the wafers, which have been processed up to and including the approximately 10 nm thick sacrificial oxide layer 27 (see FIG. 6), are now subjected to a wet etch treatment in the bath 4 containing a solution 5 of 0.5 wt. % HF in water. The solution is prepared by mixing the desired ratio of, for example, about 49 wt. % HF with deionized water, and bringing it to the desired etch temperature, being 21° C. in the present example. After the solution 5 has been sufficiently mixed and has reached the desired etch temperature of 21° C., the conductivity of the solution 5 is monitored by the means 12, in the present example the electrodeless "flow-through" conductivity sensor, which monitored conductivity $C_M$ is considered to be the starting desired conductivity $C_D$. The starting desired conductivity is, for example, 80000 μS(iemens)/cm.

The successive batches of wafers are immersed in the solution 5 at first time intervals $\tau_1$, which first time intervals $\tau_1$ each consist of a processing period during which the sacrificial oxide layer 27 is removed from the surface of the wafers according to the above-mentioned reaction, in which fluosilicic acid ($H_2SiF_6$) and water are formed, and a waiting period following the removal of the wafers from the bath 4 at the end of the processing period.

During the wet treatment of the successive batches of wafers, the conductivity of the solution 5 is monitored using the means 12, in the present example the electrodeless "flow-through" conductivity sensor. The monitored conductivity $C_M$ is determined mainly by the concentrations of the ionic components $H^+$, $F^-$, $HF_2^-$, and $SiF_6^{2-}$, which originate from the hydrofluoric acid used as the active component and from the fluosilicic acid ($H_2SiF_6$) formed according to the above-mentioned reaction. The monitored conductivity $C_M$ changes as a result of several processes taking place, such as consumption of hydrofluoric acid according to the above-mentioned reaction, evaporation of hydrofluoric acid and, in particular, water from the solution, formation of fluosilicic acid ($H_2SiF_6$) according to the above-mentioned reaction, and drag-out as a result of the removal of the wafers from the bath at the end of the processing period.

At second time intervals $\tau_2$ during the wet treatment of the successive batches of wafers, the monitored conductivity $C_M$ is brought to about the desired conductivity $C_D$ by the controlling means 13, which take corrective action whereupon the hydrofluoric acid or the deionized water, or both, is added to the solution 5 in the bath 4. However, no compensation is carried through at the second time intervals $\tau_2$ for the contribution of the fluosilicic acid ($H_2SiF_6$) to the monitored conductivity, which fluosilicic acid is formed as a result of the removal of the sacrificial oxide layer 27. Without further action, this will lead to a decrease in the concentration of the hydrofluoric acid and, hence, in the rate of removal of the thermal silicon oxide during the wet treatment of the successive batches of wafers. Therefore, the desired conductivity $C_D$ is changed, in the present example increased, with a value $\Delta C_D$ at third time intervals $\tau_3$ during the wet treatment of the successive batches of wafers, which value $\Delta C_D$ is determined by the computing means 14 at each one of the third time intervals $\tau_3$ on the basis of the amount $\Delta G$ of thermal silicon oxide removed during the latest, completed one of the third time intervals $\tau_3$. The value $\Delta C_D$ is advantageously determined on the basis of the amount $\Delta G$ by dividing this amount by the reference amount $\Delta G_{ref}$ of thermal silicon oxide removed during processing of the reference batch of wafers, and multiplying of this amount by the corresponding reference change $\Delta C_{ref}$, in the present example a reference increase, in conductivity monitored during processing of the reference batch of wafers, i.e.:

$$\Delta C_D = \Delta G \cdot \frac{\Delta C_{ref}}{\Delta G_{ref}}$$

In order to counteract the occurrence of spatial non-uniformities in the chemical composition of the solution 5 in the bath 4, the desired conductivity $C_D$ is advantageously changed only during the waiting period of each one of the first time intervals $\tau_1$. The third time intervals $\tau_3$ will hence advantageously run from waiting period to waiting period. For the same reason as mentioned above, the monitored conductivity $C_M$ is advantageously brought to about the desired conductivity $C_D$ only during the waiting period of each one of the first time intervals $\tau_1$. Consequently, also the second time intervals $\tau_2$ advantageously run from waiting period to waiting period. During such a waiting period the monitored conductivity $C_M$ is brought to about the desired conductivity $C_D$ at sub time intervals.

The above procedure will now be explained in more detail for the first one of the successive batches of wafers, which have been processed up to and including the approximately 10 nm thick sacrificial oxide layer 27. For reasons of clarity, it is assumed that the TEOS silicon oxide layer 26, which fills the trenches 24 and is exposed to the solution 5 as well, has similar material properties and a similar etch behavior as the sacrificial oxide layer 27. Due to the densification of the TEOS silicon oxide layer 26, the TEOS silicon oxide will indeed closely resemble the thermal silicon oxide of the sacrificial oxide layer 27.

The first batch contains, for example, 25 wafers (N), each one of them having a surface area of, for example, 324 cm$^2$ (A), which corresponds to the surface area of an 8 inch diameter wafer. The percentage of the surface area of each one of the wafers covered by the sacrificial oxide layer 27 is taken to be 200 (x). The density of the thermal silicon oxide is, for example, 2.27 g/cm$^3$ ($\rho$). The duration of the processing period is determined beforehand on the basis of the etch rate corresponding to the concentration of the hydrofluoric acid in the solution 5, in the present example about 2.2 nm/min, the thickness of the sacrificial oxide layer 27 to be removed, in the present example about 10 nm, and a percentage of overetch time in order to ensure complete removal of the sacrificial oxide layer 27. It should be realized that a small percentage of overetch time is always needed, as remainders of the sacrificial oxide layer 27, which are left behind on the surface of the wafers after etching, will seriously deteriorate the performance of the semiconductor devices. However, in order to counteract the occurrence of kinks 30 (see FIG. 8), the percentage of overetch time should be kept as small as possible. Considering that the overetch time is about 10%, the duration of the processing period is about 5 minutes. The removed thickness of thermal silicon oxide consequently amounts to about 11 nm ($\Delta d$). This value also includes the thickness over which the TEOS silicon oxide layer 26 is etched during the overetch time.

After having removed the first batch of wafers from the bath 4, the value $\Delta C_D$, with which the desired conductivity $C_D$ is to be increased, is determined by the computing means 14. This is advantageously carried out by program means 15, which uses the number of wafers (N), the surface area of each one of the wafers (A), the percentage of the surface area of each one of the wafers covered by the sacrificial oxide layer 27 (x), the removed thickness of the sacrificial oxide layer 27 ($\Delta d$) and the density of the thermal silicon oxide ($\rho$) as parameters. The program means 15 may comprise an equation of, for example, the following type:

$$\Delta C_D = (N \cdot A \cdot x \cdot \Delta d \cdot \rho) \cdot \frac{\Delta C_{ref}}{\Delta G_{ref}}$$

In the present example, the value $\Delta C_D$, with which the earlier above-mentioned starting desired conductivity $C_D$ of about 80000 µS(iemens)/cm is to be increased, is calculated to be about 550 µS(iemens)/cm. Hence, the renewed desired conductivity $C_D$ amounts to 80550 µS(iemens)/cm. In order to minimize the waste of hydrofluoric acid, it may be advantageous to increase the desired conductivity $C_D$ immediately after having removed the wafers from the bath. During the waiting period, the monitored conductivity $C_M$ is brought to about the renewed desired conductivity $C_D$ at the above-mentioned sub time intervals by adding the hydrofluoric acid or the deionized water, or both, to the solution 5. In this way, evaporation of hydrofluoric acid and water, in particular, can be compensated for. At the start of the processing period of the second batch of wafers processed up to and including the sacrificial oxide layer 27, the monitored conductivity $C_M$ equals about the renewed desired conductivity $C_D$ of 80550 µS(iemens)/cm. The above-described procedure is repeated for the second batch and for further batches until the removal or etch rate starts to deviate. At that point the solution 5 in the bath 4 will have to be renewed.

Experimentally, it has been found that, with the method in accordance with the invention, a batch-to-batch etch rate stability of within 3% can be reached for 5 days of lifetime of the bath, whereas with the prior art method the batch-to-batch etch rate stability is within 12 to 15% for only 1 to 2 days of lifetime of the bath.

It will be apparent that the invention is not limited to the embodiments described above, but that many variations are possible to those skilled in the art within the scope of the invention. It is obvious that other ways than those described above can be thought of for determining at each one of the third time intervals the value with which the desired conductivity is to be changed, which value is based on the amount of the material removed during the latest, completed one of the third time intervals. Furthermore, corrective factors can be introduced to determine the above-mentioned value, which corrective factors may compensate for e.g. losses of the active component, and changes in the acidity of the solution as a result of the formation of the ionic components, which changes in acidity may adversely affect the etch rate stability of the solution. The third time intervals may be chosen such that. the desired conductivity is changed after a certain amount of the material has been removed instead of after every processing period regardless of the amount of the material removed. In this way, several batches may have been processed before the desired conductivity is changed. Although the invention has been described for a dilute solution of hydrofluoric acid (HF) in water, it will be obvious that the invention also applies to more concentrated solutions of hydrofluoric acid in water. In addition, the invention also applies to solutions comprising other chemicals such as, for example, ammonia hydrogen peroxide solutions ($NH_4OH/H_2O_2/H_2O$), which can be effectively used for particle removal with (re-)growth of clean chemical oxide on silicon surfaces, and are known as standard clean 1. Although the invention has been illustrated for semiconductor devices, which are also referred to as active devices, the invention is also applicable to passive devices such as, for example, thin-film capacitors and resistors. In the above-described method of wet etching thermal silicon oxide, wherein silicon bodies serve as supports, the wafers have been processed up to and including the sacrificial oxide layer. Besides wafers comprising semiconductor bodies, which are commonly applied in the manufacture of semiconductor devices, the method of the invention can also be advantageously applied to wafers comprising, for example, glass bodies or silicon-on-insulator (SOI) bodies. Glass bodies can be used in the manufacture of, for example, thin-film transistors and active arrays for driving liquid crystal displays (LCD's), whereas silicon-on-insulator (SOI) bodies can be used for high-voltage devices, and high-frequency devices for e.g. telecom applications. Furthermore, the apparatus for carrying out the method in accordance with the invention may be part of a so-called wet bench comprising a series of baths.

What is claimed is:

1. A method of manufacturing electronic devices in which method, wafers, which are provided at a surface with a material to be removed, are subjected, while being divided into successive batches, to a wet treatment in a bath containing a solution of an acid or base in a solvent, during which wet treatment the successive batches of wafers are immersed in the solution at first, second, and third time intervals, wherein each time interval consists of a processing period during which the material is removed from the surface of the wafers, thereby forming ionic components, and a waiting period following the removal of the wafers from the bath at the end of the processing period, during which wet treatment of the successive batches the conductivity of the solution is monitored, which monitored conductivity is brought to approximately a first desired conductivity at the second time interval during the wet treatment of the successive batches by adding at least one of either the acid, base, or the solvent to the solution inside the bath to compensate for a change in concentration of the solvent, wherein at the third time interval during the wet treatment of the successive batches, a second desired conductivity is determined on the basis of an amount of the ionic components formed as a result of the removal of the material from the wafers, and wherein the solvent comprises $H_2O$, $H_2O_2$ or a combination of $H_2O$ and $H_2O_2$.

2. A method as claimed in claim 1, wherein the second desired conductivity is determined on the basis of the amount of the ionic components formed as a result of the removal of the material from the wafers by dividing the first desired conductivity by a previously determined reference amount of the material removed during a step of processing of a reference batch of wafers to produce a ratio and multiplying the ratio by a corresponding reference change in conductivity monitored during processing of the reference batch of wafers.

3. A method as claimed in claim 1, wherein the monitored conductivity is brought to approximately the first desired conductivity only during the waiting period of the second time interval.

4. A method as claimed in claim 1, wherein hydrofluoric acid is applied as the acid.

5. A method as claimed in claim 1, wherein the material to be removed comprises silicon oxide.

6. A method as claimed in claim 4, wherein the hydrofluoric acid is applied in a weight percentage in the range from about 0.05 to 5.0.

* * * * *